US012721118B2

(12) United States Patent
Wang et al.

(10) Patent No.: US 12,721,118 B2
(45) Date of Patent: Aug. 25, 2026

(54) SEMICONDUCTOR STRUCTURE AND METHOD FOR FORMING SAME

(71) Applicants: Semiconductor Manufacturing International (Beijing) Corporation, Beijing (CN); Semiconductor Manufacturing International (Shanghai) Corporation, Shanghai (CN)

(72) Inventors: Bingquan Wang, Beijing (CN); Siriguleng Zhang, Beijing (CN); Dayong Yan, Beijing (CN); Zhigao Wang, Beijing (CN); Daming Zhang, Beijing (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 503 days.

(21) Appl. No.: 18/202,412

(22) Filed: May 26, 2023

(65) Prior Publication Data

US 2023/0402316 A1 Dec. 14, 2023

(30) Foreign Application Priority Data

Jun. 9, 2022 (CN) ......................... 202210646937.0

(51) Int. Cl.
*H01L 23/48* (2006.01)
*H01L 23/52* (2006.01)
(Continued)

(52) U.S. Cl.
CPC ....... *H10W 10/17* (2026.01); *H10W 10/0143* (2026.01); *H10W 20/42* (2026.01);
(Continued)

(58) Field of Classification Search
CPC ........... H01L 21/76229; H01L 23/5226; H01L 23/60; H01L 24/08; H01L 24/80; H01L 2224/08145; H01L 2224/80895; H01L 2224/80896; H01L 25/0657; H01L 24/05; H01L 2224/0401; H01L 2224/73204; H01L 2224/0603; H01L 25/0652;
(Continued)

(56) References Cited

U.S. PATENT DOCUMENTS

2013/0323875 A1* 12/2013 Park ..................... H10F 39/182 438/70
2018/0182808 A1* 6/2018 Kim ..................... H10F 39/014

* cited by examiner

*Primary Examiner* — Niki H Nguyen
(74) *Attorney, Agent, or Firm* — Crowell & Moring LLP

(57) ABSTRACT

The present disclosure relates to a semiconductor structure and a method for forming the semiconductor structure. The semiconductor structure includes: a first wafer, including a first substrate and a first dielectric layer on the first substrate, a pad groove and a pad structure in the pad groove are formed in the first substrate and the first dielectric layer, and the pad groove extends through the first substrate along a direction from the first substrate to the first dielectric layer and extends into a partial thickness of the first dielectric layer; and an isolation ring structure, arranged in the first substrate around the pad groove and extending through the first substrate along the direction from the first substrate to the first dielectric layer.

18 Claims, 5 Drawing Sheets

(51) Int. Cl.
*H01L 29/40* (2006.01)
*H10W 10/00* (2026.01)
*H10W 10/17* (2026.01)
*H10W 20/42* (2026.01)
*H10W 42/60* (2026.01)
*H10W 80/00* (2026.01)
*H10W 90/00* (2026.01)

(52) U.S. Cl.
CPC .......... *H10W 42/60* (2026.01); *H10W 80/312* (2026.01); *H10W 80/327* (2026.01); *H10W 90/792* (2026.01)

(58) Field of Classification Search
CPC . H01L 2924/19041; H01L 2224/08146; H01L 21/76831; H01L 2224/04042; H01L 2224/0557; H01L 2224/05572; H01L 2224/16227; H01L 2224/02371; H01L 2224/02372; H01L 25/0655; H01L 2224/81815; H01L 23/53295; H01L 2224/05548; H01L 2225/1058; H01L 21/56; H01L 2224/05009; H01L 2224/08235; H01L 2224/32137; H01L 2224/81191; H01L 2224/73203; H01L 2225/06562; H01L 2225/06586; H01L 2224/08237
See application file for complete search history.

SEMICONDUCTOR STRUCTURE AND METHOD FOR FORMING SAME

CROSS REFERENCE TO RELATED APPLICATIONS

This application is based on and claims priority to Chinese patent Application No. 202210646937.0, filed Jun. 9, 2022, the entire content of which is incorporated herein by reference.

TECHNICAL FIELD

The present disclosure relates to the technical field of semiconductor manufacturing, and in particular, to a semiconductor structure and a method for forming the same.

BACKGROUND

An image sensor is generally classified into two categories: a charge coupled device (CCD) image sensor and a complementary metal oxide semiconductor image sensor (CMOS Image Sensor, CIS) depending on different operating principles and physical structures. The CMOS image sensor has the characteristics such as low power consumption, low costs, and compatibility with the CMOS process, and therefore increasingly more widely used.

In a current manufacturing process, a chip stacking technology is usually used, such as a 3D chip stacking technology. An image sensor module is fabricated in one chip, a signal processing module is fabricated in another chip, and then chips are stacked together by bonding between wafers to form the image sensor. In addition, in order to avoid blocking of light entering a photosensitive semiconductor by a metal interconnecting layer and improve utilization efficiency of light by a pixel unit, a back side illuminated (BSI) CMOS image sensor is formed by using the BSI process. Specifically, the BSI CMOS image sensor transfers a circuit part originally between a lens and the photosensitive semiconductor to a position around or under the photosensitive semiconductor, so that the light may directly enter the photosensitive semiconductor. Therefore, the blocking of the light entering the photosensitive semiconductor by the metal interconnecting layer can be avoided, and the utilization efficiency of light by the pixel unit can be improved.

SUMMARY

The present disclosure provides a semiconductor structure and a method for forming the same, so as to improve performance of the formed semiconductor structure.

In an aspect of the present disclosure, a semiconductor structure is provided. The semiconductor structure may include:

- a first wafer, including a first substrate and a first dielectric layer on the first substrate, a pad groove and a pad structure in the pad groove are formed in the first substrate and the first dielectric layer, and the pad groove extends through the first substrate along a direction from the first substrate to the first dielectric layer and extends into a partial thickness of the first dielectric layer; and
- an isolation ring structure, arranged in the first substrate around the pad groove and extending through the first substrate along the direction from the first substrate to the first dielectric layer.

In another aspect of the present disclosure, a method for forming a semiconductor structure is provided. The method may include: providing a first wafer, the first wafer includes a first substrate and a first dielectric layer on the first substrate; forming an isolation ring structure in the first substrate;

- forming a pad groove in the first substrate and the first dielectric layer, the pad groove extends through the first substrate along a direction from the first substrate to the first dielectric layer and extends into a partial thickness of the first dielectric layer, and the pad groove is surrounded by the isolation structure in the first substrate; and forming a pad structure in the pad groove.

Compared with the prior art, the present disclosure has the following advantages:

It may be seen that due to the existence of the isolation ring structure, the pad groove can be isolated from the pad structure arranged in the pad groove in the first substrate. In this way, in the process of realizing the electrical connection of the pad structure to the outside or probing, an adverse effect of parasitic capacitance generated by a sidewall of the pad groove on the first substrate can be avoided, and electric leakage of the sidewall of the pad groove to the first substrate can be prevented. Therefore, the performance of the formed semiconductor structure can be improved.

DETAILED DESCRIPTION

An existing semiconductor structure has poor performance. In order to address the problem, a form of the present disclosure provides a semiconductor structure. The semiconductor structure includes: a first wafer, including a first substrate and a first dielectric layer on the first substrate, a pad groove and a pad structure in the pad groove are formed in the first substrate and the first dielectric layer, and the pad groove extends through the first substrate along a direction from the first substrate to the first dielectric layer and extends into a partial thickness of the first dielectric layer; and an isolation ring structure, arranged in the first substrate around the pad groove and extending through the first substrate along the direction from the first substrate to the first dielectric layer.

It may be seen that due to the existence of the isolation ring structure, the pad groove can be isolated from the pad structure arranged in the pad groove in the first substrate. In this way, in the process of realizing the electrical connection of the pad structure to the outside or probing, an adverse effect of parasitic capacitance generated by a sidewall of the pad groove on the first substrate can be avoided, and electric leakage of the sidewall of the pad groove to the first substrate can be prevented. Therefore, the performance of the formed semiconductor structure can be improved.

To make the foregoing objectives, features, and advantages of the present disclosure more comprehensible, detailed description is made to specific forms of the present disclosure in combination with accompanying drawings.

Figure 1:
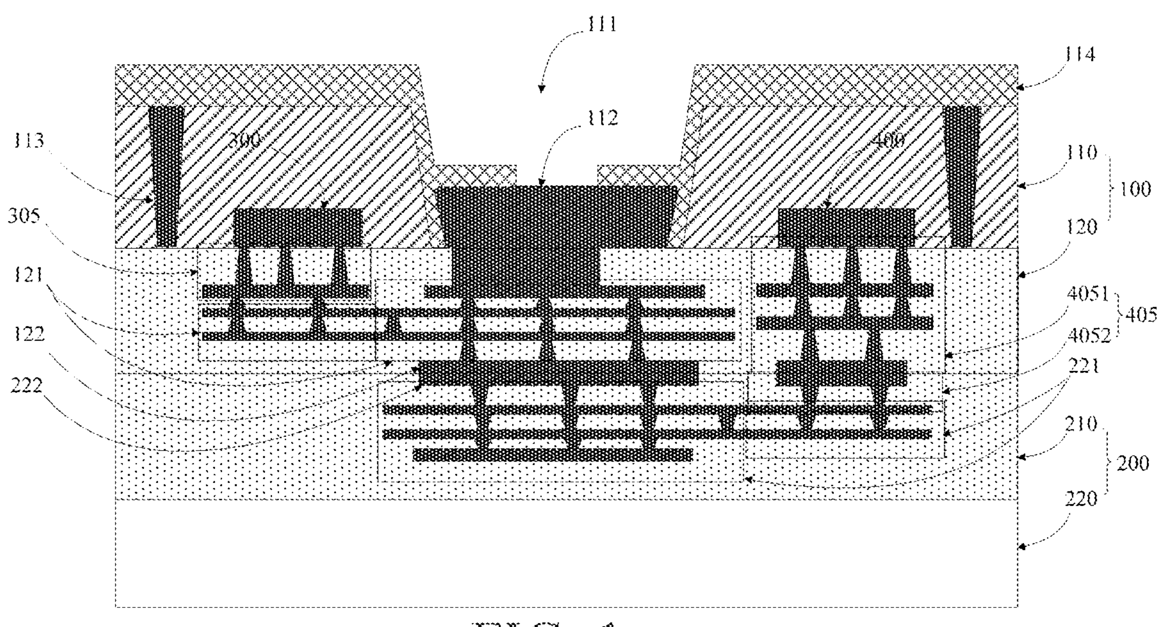
FIG. 1 is a schematic structural diagram of a semiconductor structure according to a form of the present disclosure.
Figure 3:
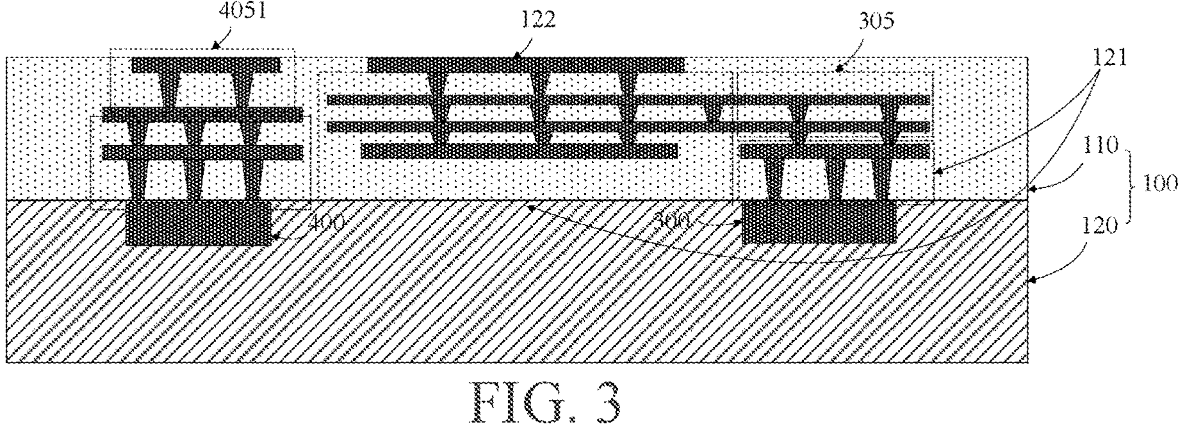
FIG. 3 to FIG. 8 are schematic diagrams of a middle structure formed using steps of a method for forming a semiconductor structure according to a form of the present disclosure.

FIG. 1 shows a schematic diagram of a semiconductor structure according to a form of the present disclosure. Referring to FIG. 1, the semiconductor structure includes: a first wafer 100, where the first wafer 100 includes a first substrate 110 and a first dielectric layer 120 on the first substrate 110, and includes a first region I (as shown in FIG. 3), a pad groove 111 and a pad structure 112 in the pad groove 111 are formed in the first substrate 110 of the first region I, and the pad groove 111 extends through the first substrate 110 along a direction from the first substrate 110 to the first dielectric layer 120 and extends into the first dielectric layer to a partial thickness 120; and an isolation ring structure 113, arranged in the first substrate 110 of the first region I around the pad groove 111 and extending through the first substrate 110 along the direction from the first substrate 110 to the first dielectric layer 120.

In this form, the semiconductor structure is a 3D stacked back side illuminated (BSI) CMOS image sensor. Accordingly, the semiconductor structure includes the first wafer 100.

In this form, the first wafer 100 is a photosensitive wafer. Specifically, the first wafer 100 has a plurality of image sensor chips. The image sensor chip is configured to receive a light signal and convert the light signal to an electrical signal. The image sensor chip is correspondingly a CMOS image sensor chip.

In this form, after the first wafer 100 is bonded to the second wafer, the first wafer 100 and the second wafer are stacked together to form a CMOS image sensor.

In this form, the first wafer 100 includes the first substrate 110.

In this form, the first substrate 110 is a silicon substrate. In other forms, a material of the first substrate may further be other materials such as germanium, silicon germanium, silicon carbide, gallium arsenide, indium gallium, or the like. The substrate may further be other types of substrates such as a silicon substrate on an insulator or a germanium substrate on the insulator.

In this form, the first wafer 100 further includes the first dielectric layer 120 on the first substrate 110.

The first dielectric layer 120 is configured to achieve electrical isolation of a first interconnecting structure formed in the first dielectric layer.

A material of the first dielectric layer 120 may be a low-k dielectric material or an ultra-low-k dielectric material, so that parasitic capacitance of the first interconnecting structure can be effectively reduced, thereby reducing a RC delay of a device. The low-k dielectric material is a dielectric material having a relative dielectric constant greater than or equal to 2.6 and less than or equal to 3.9, and the ultra-low-k dielectric material is a dielectric material having a relative dielectric constant less than 2.6.

In this form, a material of the first dielectric layer 120 is porous carbon-doped silicon oxide (SiOCH). In other forms, the material of the first dielectric layer 120 may further be silanol (SiOH), fluorine-doped silicon oxide (FSG), boron-doped silicon oxide (BSG), phosphorus-doped silicon oxide (PSG), boron and phosphorus doped silicon oxide (BPSG), hydrogen silsesquioxane (HSQ), or methylsilsesquioxane (MSQ).

In this form, the first wafer 100 includes a first region I. A pad groove 111 and a pad structure 112 in the pad groove 111 are formed in the first substrate 110 of the first region I and the first dielectric layer 120.

The first region I is a portion of a chip region of the first wafer 100. A CMOS device is formed in the chip region of the first wafer 100. The CMOS device includes, but is not limited to, a transistor and a photodiode.

The pad groove 111 is configured for the pad structure 112 to be formed therein, thereby realizing the electrical connection to the first interconnecting structure in the first dielectric layer 120 and the outside through the pad structure 112, and realizing probing of the formed 3D stacked BSI CMOS image sensor.

In this form, the pad groove 111 extends through the first substrate 110 along the direction from the first substrate 110 to the first dielectric layer 120, and further extends into the first dielectric layer to a partial thickness 120, so that the pad structure 112 formed in the pad groove may contact the first interconnecting structure in the first dielectric layer 120, so as to enable the electrical connection to the first interconnecting structure.

In this form, the pad structure 112 includes a pad via (not shown) and a metal pad layer (not shown) above the pad via. In other forms, the pad structure 112 may further include a plurality of metal layers and a plurality of vias used for interconnecting the metal layers.

In this form, a material of the pad structure 112 is aluminum. Aluminum has advantages such as a light weight, strong machinability, good physical and mechanical properties, and good resistance to corrosion, and is adapted to be used as the material of the pad structure.

In this form, the semiconductor structure further includes a passivation layer 114, arranged on a surface of the first substrate 110 facing away from the first dielectric layer 120 and covering a sidewall of the pad groove 111 and a portion of a top surface of the pad structure 112.

The passivation layer 114 is configured to achieve isolation between the sidewall of the pad groove 111 and the pad structure 112, so that parasitic capacitance of the sidewall of the pad groove 111 can be reduced. In addition, the passivation layer 114 is further configured to protect the surface of the first substrate 110 facing away from the first dielectric layer 120, the sidewall of the pad groove 111, and the part of the top surface of the pad structure 112.

In this form, a material of the passivation layer 114 is silicon nitride (SiN). In other forms, the material of the passivation layer 114 may further be at least one of silicon oxide (SiO2), silicon carbide (SiC), or a high-k dielectric material.

An isolation ring structure 113 is further formed in the first substrate 110 of the first region I. The isolation ring structure 113 is arranged in the first substrate 110 of the first region I around the pad groove 111, and extends through the first substrate 110 along the direction from the first substrate 110 to the first dielectric layer 120.

The isolation ring structure 113 is arranged around the pad groove 111 and extends through the first substrate 110 to enable full electrical isolation of the pad groove 111.

Specifically, the arrangement of the isolation ring structure 113 can isolate the pad groove 111 from the pad structure 112 arranged in the pad groove 111 in the first substrate 110. In this way, in the process of realizing the electrical connection of the pad structure 112 to the outside or probing, an adverse effect of parasitic capacitance generated by a sidewall of the pad groove 111 on the first substrate can be avoided, and electric leakage of the sidewall of the pad groove 111 to the first substrate can be prevented. Therefore, the performance of the formed CMOS image sensor can be improved.

In this form, the isolation ring structure 113 includes a first deep trench isolation structure. Specifically, the first deep trench isolation structure is arranged in the first substrate 110 of the first region I around the pad groove 111, and extends through the first substrate 110 along the direction from the first substrate 110 to the first dielectric layer 120. In other words, the first deep trench isolation structure constitutes the isolation ring structure 113.

In this form, the first deep trench isolation structure includes a first deep trench, a first isolation layer on a bottom and a sidewall of the first deep trench, and a first isolation material layer on the first isolation layer and filling the first deep trench.

In this form, a material of the first isolation layer is silicon oxide. In other forms, the first isolation layer may further be made of other suitable materials, such as a high-k dielectric material.

In this form, the first isolation material layer is tungsten. In other forms, the first isolation material layer may further be made of polysilicon or other metal materials (such as copper).

In other forms, the isolation ring structure includes a shallow trench isolation structure and a second deep trench isolation structure on the shallow trench isolation structure.

In the form, the shallow trench isolation structure includes a shallow trench and a second isolation material layer filling the shallow trench. In additional forms, the shallow trench may further be selectively filled with a conductive medium, such as copper or tungsten.

Specifically, a material of the second isolation material layer is silicon oxide ($SiO_2$).

In the form, the second deep trench isolation structure includes a second deep trench, a second isolation layer on a bottom and a sidewall of the second deep trench, and a second isolation material layer on the second isolation layer and filling the second deep trench.

For the second deep trench, the second isolation layer, and the second isolation material layer, reference is made to the corresponding content in the first deep trench isolation structure for implementation, and details will not be described herein again.

One isolation ring structure 113 is arranged by way of example above. It may be understood that a plurality of isolation ring structures 113 may further be arranged according to an actual requirement, which is not limited herein.

Figure 2:
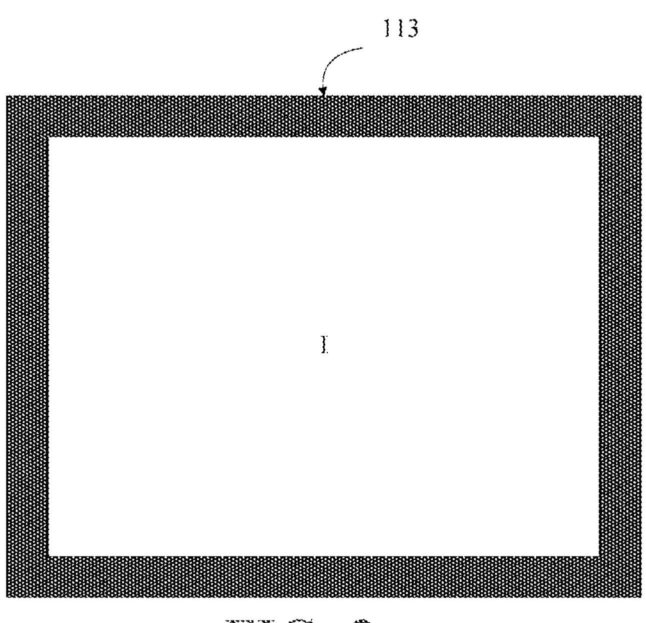
FIG. 2 is a schematic top view of an isolation ring structure and a first region according to a form of the present disclosure.

A shape of the isolation ring structure 113 may be the same as or different from a shape of the first region I. As shown in FIG. 2, in this form, the shape of the isolation ring structure 113 is the same as the shape of the first region I, which is a rectangle. In other forms, the isolation ring structure may further be circular, or the like.

It should be noted that, in order to avoid the adverse effect on other structures in the first wafer 100, a spacing between the isolation ring structure 113 and the pad groove 111 should be sufficiently large. In an example, when the CMOS image sensor chip in the first wafer 100 is a photon time of flight (TOF) CMOS image sensor chip, the spacing between the isolation ring structure 113 and the pad groove 111 is greater than 10 μm.

In this form, a first interconnecting structure 121 and a first bonding and interconnecting layer 122 are formed in the first dielectric layer 120 of the first region I.

The first interconnecting structure 121 is configured to be electrically connected to the pad structure 111 and the first bonding and interconnecting layer 122, and is configured to be electrically connected to a second interconnecting structure in the second wafer after the first wafer 100 is bonded to the second wafer.

The first interconnecting structure 121 includes a first interconnecting layer structure (not shown) composed of a plurality of metal interconnecting lines and a first via structure (not shown) configured to connect the metal interconnecting lines.

The first bonding and interconnecting layer 122 is configured to be electrically connected to the second wafer after bonding the first wafer 100 to the second wafer, so as to enable the electrical connection between the first wafer 100 and the second wafer.

In this form, a material of the first bonding and interconnecting layer 122 is copper. In other forms, the first bonding and interconnecting layer may further be made of other metal materials, such as tungsten, aluminum, and the like.

In this form, the semiconductor structure is a 3D stacked BSI CMOS image sensor. Correspondingly, the semiconductor structure further includes a second wafer 200 bonded to the first wafer 100.

In this form, the second wafer 200 is a signal processing (Digital Signal Processor, DSP) wafer. Specifically, the second wafer 200 has a plurality of signal processing chips. A logic circuit for signal control, reading, and processing is formed in each signal processing chip, and the signal processing chip is configured to process an electrical signal converted from a light signal.

The signal processing chip in the second wafer 200 is arranged opposite to the image sensor chip and the signal processing chip in the first wafer 100, so that the image sensor chip and the signal processing chip are less restricted by each other, and both the image sensor chip and the signal processing chip can easily obtain optimal performance. In this way, packaging performance is improved. In addition, the image sensor chip and the signal processing chip may be combined arbitrarily, so that the semiconductor structure has higher flexibility.

In addition, the image sensor chip and the signal processing chip are arranged on different chips, so that the image sensor chip has a smaller area, thereby reducing design costs of the image sensor chip, and accordingly reducing the packaging costs.

Furthermore, the second wafer 200 may further play a role of supporting the first wafer 100. During subsequent grinding of the first wafer 100, the second wafer 200 can improve mechanical strength of the first wafer 100 and reduce a probability of cracking of the first wafer 100, thereby improving reliability of the semiconductor structure.

In this form, the second wafer 200 includes a second substrate 210 and a second dielectric layer 220 on the second substrate 210, and the second dielectric layer 220 faces the first dielectric layer 120.

In this form, a second interconnecting structure 221 and a second bonding and interconnecting layer 222 are formed in the second dielectric layer 220 of the second region II.

For the second substrate 210 and the second dielectric layer 220, reference is made to the description of the first substrate 110 and the first dielectric layer 120, and details will not be described herein again.

In this form, the second wafer 200 includes a second region II. The second region II is arranged opposite to the first region I.

Correspondingly, the second interconnecting structure 221 and the second bonding and interconnecting layer 222 are formed in the second dielectric layer 220 of the second region II.

For the second interconnecting structure 221 and the second bonding and interconnecting layer 222, reference is made to the above content of the first interconnecting structure 121 and the first bonding and interconnecting layer 122 for implementation, and details will not be described herein again.

In this form, the semiconductor structure further includes a first electro-static discharge (ESD) protection module 300, arranged in the first substrate 110 on a first side of the pad groove 111 and inside the isolation ring structure 113, and electrically connected to the first wafer 100.

The first ESD protection module 300 is configured to perform ESD protection for the first wafer 100. Specifically, the first ESD protection module 300 is configured to release ESD charges on a signal input terminal and a signal output terminal of the first wafer 100, so as to protect an internal circuit of the first wafer 100 from being damaged by static electricity.

The first ESD protection module 300 may be any type of component adapted to perform electro-static protection for the first wafer 100, which is not limited herein.

Correspondingly, the semiconductor structure in this form further includes a first device interconnecting structure 305, arranged in the first dielectric layer 120 below the first ESD protection module 300 and electrically connected to the first ESD protection module 300 and the first interconnecting structure 121.

The first device interconnecting structure 305 is configured to enable the electrical connection between the first ESD protection module 300 and the first interconnecting structure 121, so as to enable the electrical connection between the first ESD protection module 300 and the first wafer 100.

In this form, a portion of the first interconnecting structure 121 extends into the first dielectric layer 120 below the first ESD protection module 300. The first device interconnecting structure 305 is arranged in the first dielectric layer 120 below the first ESD protection module 300. Along the direction from the first substrate 110 to the first dielectric layer 120, the first device interconnecting structure 305 is arranged above and contacts the part of the first interconnecting structure 121 extending into the first dielectric layer 120 below the first ESD protection module 300, so as to enable the electrical connection to the first interconnecting structure 121.

The first device interconnecting structure 305 may include a first device interconnecting layer composed of a plurality of metal layers and a first device via structure configured to connect the metal layers.

In this form, the semiconductor structure further includes a second ESD protection module 400 arranged in the first substrate 110 on a second side of the pad groove 111 and inside the isolation ring structure 113. The first side is arranged opposite to the second side.

The second ESD protection module 400 is configured to protect ESD protection for the second wafer 200. Specifically, the second ESD protection module 400 is configured to release ESD charges on a signal input terminal and a signal output terminal of the second wafer 200, so as to protect an internal circuit of the second wafer 200 from being damaged by static electricity.

Correspondingly, the semiconductor structure in this form further includes a second device interconnecting structure 405, arranged in the first dielectric layer 120 and the second dielectric layer 210 below the second ESD protection module 400 and electrically connected to the second ESD protection module 400 and the second interconnecting structure 221.

The second device interconnecting structure 405 is configured to enable the electrical connection between the second ESD protection module 400 and the second interconnecting structure 221, so as to enable the electrical connection between the second ESD protection module 400 and the second wafer 200.

In this form, a portion of the second interconnecting structure 221 extends into the second dielectric layer 220 below the second ESD protection module 400. The second device interconnecting structure 405 is arranged in the first dielectric layer 120 and the second dielectric layer 220 below the second ESD protection module 400. Along the direction from the first substrate 110 to the first dielectric layer 120, the second device interconnecting structure 405 is arranged above and contacts the part of the second interconnecting structure 221 extending into the second dielectric layer 220 below the second ESD protection module 400, so as to enable the electrical connection to the second interconnecting structure 221.

In this form, the second device interconnecting structure 405 includes a first sub-device interconnecting structure 4051 and a second sub-device interconnecting structure 4052. The first sub-device interconnecting structure 4051 is arranged on the first dielectric layer 120 below the second ESD protection module 400, and the second sub-device interconnecting structure 4052 is arranged on the second dielectric layer 210 below the second ESD protection module 400.

As described above, in order to avoid the adverse effect on other structures in the first wafer 100, a preset spacing is defined between the isolation ring structure 113 and the pad groove 111. The first ESD protection module 300 and the second ESD protection module 400 are arranged in the first substrate 110 inside the isolation ring structure 113 and symmetrically arranged with respect to the pad groove 111. In this way, a redundant area between the isolation ring structure 113 and the pad groove 111 in the first wafer 100 may be reused. In addition, compared with the solution of arranging both the first ESD protection module 300 and the second ESD protection module 400 in the second wafer 200, a size of the second wafer 200 may be reduced, so that the sizes of the first wafer 100 and the second wafer 200 are consistent, thereby improving the integration level of the formed semiconductor structure.

Figure 9:
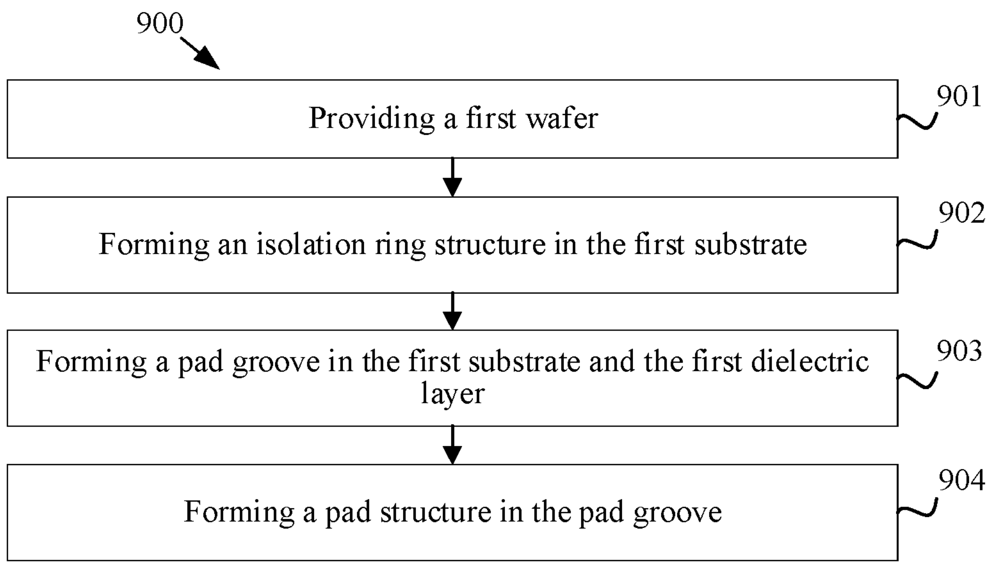
FIG. 9 is a flowchart of a method for forming a semiconductor structure according to a form of the present disclosure.

Accordingly, a form of the present disclosure further provides a method 900 for forming a semiconductor structure as shown in FIG. 9.

Referring to FIG. 3, a first wafer 100 is provided (901). The first wafer 100 includes a first substrate 110 and a first dielectric layer 120 on the first substrate 110, and the first wafer 100 includes a first region I.

In this form, the first wafer 100 is a photosensitive wafer. Specifically, the first wafer 100 has a plurality of image sensor chips. After the first wafer 100 is bonded to the second wafer subsequently, the first wafer 100 and the second wafer are configured to form a 3D stacked BSI CMOS image sensor. Therefore, the image sensor chip is correspondingly a CMOS image sensor chip.

The first wafer 100 includes the first substrate 110.

In this form, the first substrate 110 is a silicon substrate. In other forms, a material of the first substrate may further be other materials such as germanium, silicon germanium, silicon carbide, gallium arsenide, indium gallium, or the like. The substrate may further be other types of substrates such as a silicon substrate on an insulator or a germanium substrate on the insulator.

In this form, the first wafer 100 further includes a first dielectric layer 120.

A material of the first dielectric layer 120 may be a low-k dielectric material or an ultra-low-k dielectric material, so that parasitic capacitance of the first interconnecting structure formed in the first dielectric layer can be effectively reduced, thereby reducing an RC delay of a device. The low-k dielectric material is a dielectric material having a relative dielectric constant greater than or equal to 2.6 and less than or equal to 3.9, and the ultra-low-k dielectric material is a dielectric material having a relative dielectric constant less than 2.6.

In this form, a material of the first dielectric layer 120 is porous carbon-doped silicon oxide (SiOCH). In other forms, the material of the first dielectric layer may further be silanol (SiOH), fluorine-doped silicon oxide (FSG), boron-doped silicon oxide (BSG), phosphorus-doped silicon oxide (PSG), boron and phosphorus doped silicon oxide (BPSG), hydrogen silsesquioxane (HSQ), or methylsilsesquioxane (MSQ).

The first wafer 100 includes a first region I, and the first region I is a portion of a chip region of the first wafer 100. Various CMOS devices are formed in the chip region of the first wafer 100. Each CMOS device includes, but is not limited to, a transistor and a photodiode.

A first interconnecting structure 121 and a first bonding and interconnecting layer 122 are formed in the first dielectric layer 120 of the first region I.

The first interconnecting structure 121 includes a first interconnecting layer structure (not shown) composed of a plurality of metal interconnecting lines and a first via structure (not shown) configured to connect the metal interconnecting lines.

The first bonding and interconnecting layer 122 is configured to be electrically connected to the second wafer after bonding the first wafer 100 to the second wafer, so as to enable the electrical connection between the first wafer 100 and the second wafer.

In this form, a material of the first bonding and interconnecting layer 122 is copper. In other forms, the first bonding and interconnecting layer may further be made of other metal materials, such as tungsten, aluminum, and the like.

During manufacturing of the first wafer 100, the first interconnecting structure 121 and the first bonding and interconnecting layer 122 are formed in the first dielectric layer 120 of the first region I.

In this form, the semiconductor structure further includes a first ESD protection module 300. After the pad groove 111 and the isolation ring structure 113 are formed in the first substrate of the first wafer 100, the first ESD protection module 300 is arranged in the first substrate 110 on the first side of the pad groove 111 and inside the isolation ring structure 113.

The first ESD protection module 300 is configured to perform ESD protection for the first wafer 100. Specifically, the first ESD protection module 300 is configured to release ESD charges on a signal input terminal and a signal output terminal of the first wafer 100, so as to protect an internal circuit of the first wafer 100 from being damaged by static electricity.

The first ESD protection module 300 may be any type of component adapted to perform electro-static protection for the first wafer 100, which is not limited herein.

The first ESD protection module 300 is arranged in the first substrate 110 on the first side of the pad groove 111 and inside the isolation ring structure 113. In this way, the redundant area between the pad groove 111 and the isolation ring structure 113 in the first substrate 110 can be fully reused, thereby improving the integration level of the formed semiconductor structure.

During the manufacturing of the first wafer 100, the first ESD protection module 300 is embedded in the first substrate 110 of the first region I.

Correspondingly, the semiconductor structure in this form further includes a first device interconnecting structure 305, arranged in the first dielectric layer 120 below the first ESD protection module 300 and electrically connected to the first ESD protection module 300 and the first interconnecting structure 121.

The first device interconnecting structure 305 is configured to enable the electrical connection between the first ESD protection module 300 and the first interconnecting structure 121.

In this form, a portion of the first interconnecting structure 121 extends into the first dielectric layer 120 below the first ESD protection module 300. The first device interconnecting structure 305 is arranged in the first dielectric layer 120 below the first ESD protection module 300. Along the direction from the first substrate 110 to the first dielectric layer 120, the first device interconnecting structure 305 is arranged above and contacts the part of the first interconnecting structure 121 extending into the first dielectric layer 120 below the first ESD protection module 300, so as to enable the electrical connection to the first interconnecting structure 121.

The first device interconnecting structure 305 may include a first device interconnecting layer composed of a plurality of metal layers and a first device via structure configured to connect the metal layers.

During the manufacturing of the first wafer 100, the first device interconnecting structure 305 is formed in the first dielectric layer 120 of the first region I. In an example, in the process of forming the first interconnecting structure 121 in the first dielectric layer 120 of the first region I, the first device interconnecting structure 305 is formed in the first dielectric layer 120 of the first region I.

In this form, the semiconductor structure further includes a second ESD protection module 400. After the pad groove 111 and the isolation ring structure 113 are formed in the first substrate 110, the second ESD protection module 400 is arranged in the first substrate 110 on the second side of the pad groove 111 and inside the isolation ring structure 113. The first side is arranged opposite to the second side. In other words, the second ESD protection module 400 and the first ESD protection module 300 are arranged symmetrically with respect to the pad groove 111.

The second ESD protection module 400 is configured to protect ESD protection for the second wafer 200. Specifically, the second ESD protection module 400 is configured to release ESD charges on a signal input terminal and a signal output terminal of the second wafer 200, so as to protect an internal circuit of the second wafer 200 from being damaged by static electricity.

During the manufacturing of the first wafer 100, the second ESD protection module 400 is embedded in the first substrate 110 of the first region I.

Correspondingly, the semiconductor structure in this form further includes a second device interconnecting structure 405, arranged in the first dielectric layer 120 and the second dielectric layer 210 below the second ESD protection module 400 and electrically connected to the second ESD protection module 400 and the second interconnecting structure 221.

The second device interconnecting structure 405 is configured to enable the electrical connection between the second ESD protection module 400 and the second interconnecting structure 221.

In this form, a portion of the second interconnecting structure 221 extends into the second dielectric layer 220 below the second ESD protection module 400. The second device interconnecting structure 405 is arranged in the first dielectric layer 120 and the second dielectric layer 220 below the second ESD protection module 400. Along the direction from the first substrate 110 to the first dielectric layer 120, the second device interconnecting structure 405 is arranged above and contacts the part of the second interconnecting structure 221 extending into the second dielectric layer 220 below the second ESD protection module 400, so as to enable the electrical connection to the second interconnecting structure 221.

The second device interconnecting structure 405 may include a second device interconnecting layer composed of a plurality of metal layers and a second device via structure configured to connect the metal layers.

In this form, the second device interconnecting structure 405 includes a first sub-device interconnecting structure 4051 in the first dielectric layer 120 of the first region I and a second sub-device interconnecting structure 4052 in the second dielectric layer 220 of the first region I.

Accordingly, during the manufacturing of the first wafer 100 and the second wafer, the second device interconnecting structure 405 is formed. Specifically, during the manufacturing of the first wafer 100, the first sub-device interconnecting structure 4051 is formed in the first dielectric layer 120 of the first region I. During the manufacturing of the second wafer, the second sub-device interconnecting structure 4052 is formed in the second dielectric layer 220 of the second region. The second region is arranged opposite to the first region I.

In an example, in the process of forming the first interconnecting structure in the first dielectric layer 120 of the first region I, the first sub-device interconnecting structure 4051 is formed, and in the process of forming the second interconnecting structure in the second dielectric layer 220 of the second region II, the second sub-device interconnecting structure 4052 is formed.

As described above, in order to avoid the adverse effect on other structures in the first wafer 100, a preset spacing is defined between the isolation ring structure 113 and the pad groove 111. The first ESD protection module 300 and the second ESD protection module 400 are arranged in the first substrate 110 inside the isolation ring structure 113 and symmetrically arranged with respect to the pad groove 111. In this way, a redundant area between the isolation ring structure 113 and the pad groove 111 in the first wafer 100 may be reused. In addition, compared with the solution of arranging both the first ESD protection module 300 and the second ESD protection module 400 in the second wafer 200, a size of the second wafer 200 may be reduced, so that the sizes of the first wafer 100 and the second wafer 200 are consistent, thereby improving the integration level of the formed semiconductor structure.

It should be noted that various methods commonly used in the art may be selected as the method for manufacturing the first wafer 100, and details will not be described herein again.

Figure 4:
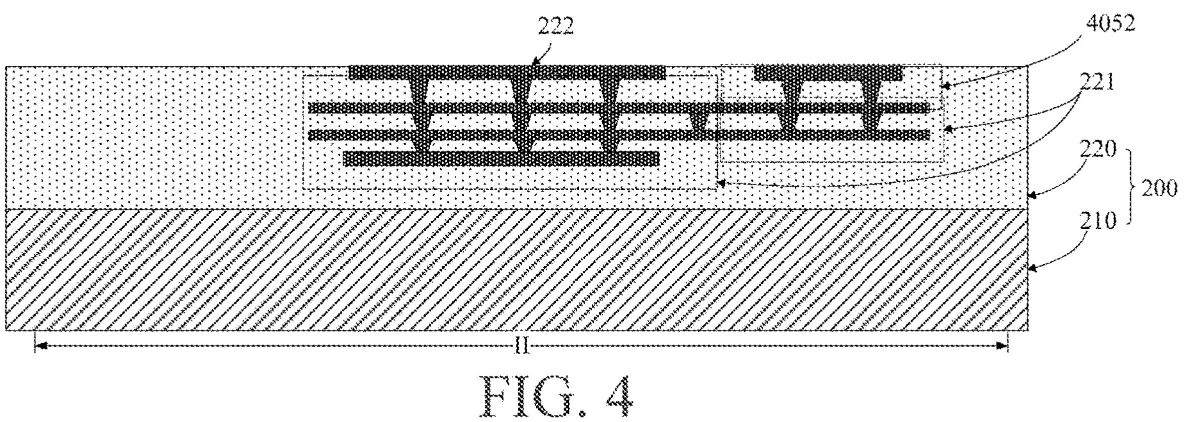

With reference to FIG. 4, in this form, the method for forming a semiconductor structure further includes providing a second wafer 200. The second wafer 200 includes a second substrate 210 and a second dielectric layer 220 on the second substrate 210. The second wafer 200 includes a second region II, and the second region II is arranged opposite to the first region I.

In this form, the second wafer 200 is a signal processing wafer. Specifically, the second wafer 200 has a plurality of signal processing chips. Each signal processing chip is configured to process an electrical signal obtained by converting a light signal.

In this form, a size of the second wafer 200 is the same as a size of the first wafer 100. Correspondingly, the second wafer 200 includes the second region II, and the second region II is at a position corresponding to the first region I.

The second wafer 200 includes a second substrate 210 and a second dielectric layer 220 on the second substrate 210. The second interconnecting structure 221 and a second bonding and interconnecting layer 222 are formed in the second dielectric layer 220 of the second region II.

For the second substrate 210, the second dielectric layer 220, the second interconnecting layer structure 221, and the second bonding and interconnecting layer 222, reference may be made to the foregoing corresponding description of the first wafer 100, and various methods commonly used in the art may be selected as the method for manufacturing the second wafer 200, and details will not be described herein again.

As described above, in this form, the second device interconnecting structure 405 includes a first sub-device interconnecting structure 4051 in the first dielectric layer 120 of the first region I and a second sub-device interconnecting structure 4052 in the second dielectric layer 220 of the first region I. Correspondingly, during the manufacturing of the second wafer 200, the second sub-device interconnecting structure 4052 is formed in the second dielectric layer 220 of the second region II. In an example, in the process of forming the second interconnecting structure in the second dielectric layer 220 of the second region II, the second sub-device interconnecting structure 4052 is formed in the second dielectric layer 220 of the first region I.

Figures 5, 6:
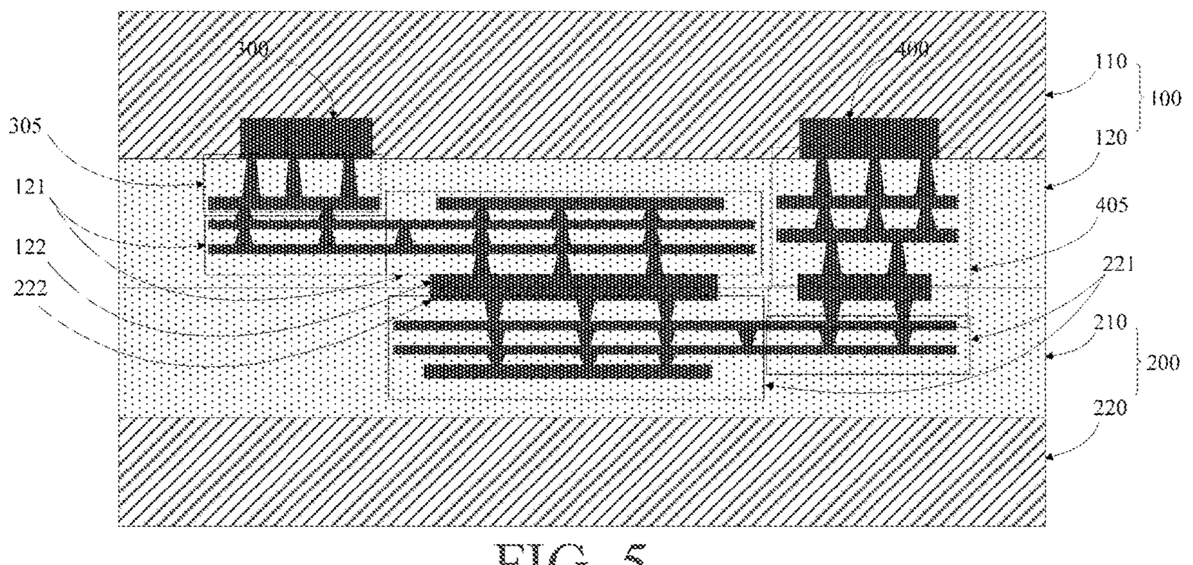

With reference to FIG. 5, in this form, the method for forming a semiconductor structure further includes orienting the first dielectric layer 120 toward the second dielectric layer 210, and bonding the first wafer 100 to the second wafer 200.

The first wafer 100 is bonded to the second wafer 200, so that the second wafer 200 supports the first wafer 100. In the subsequent process, the second wafer 200 can improve the mechanical strength of the first wafer 100 and reduce the probability of cracking of the first wafer 100, thereby improving reliability of the formed semiconductor structure.

In this form, the second wafer 200 and the first wafer 100 are bonded by using a bonding process. Specifically, the bonding process may be a fusion bonding process. By using the fusion bonding process, the second wafer 200 and the first wafer 100 are bonded by a Si—O bond, thereby improving the bonding force between the second wafer 200 and the first wafer 100.

As described above, in this form, the second device interconnecting structure 405 includes a first sub-device interconnecting structure 4051 in the first dielectric layer 120 of the first region I and a second sub-device interconnecting structure 4052 in the second dielectric layer 220 of the first region I. Accordingly, after the second wafer 200 and the first wafer 100 are bonded, the first sub-device interconnecting structure 4051 and the second sub-device interconnecting structure 4052 contact each other and electrically connected.

In this form, after the first wafer 100 is bonded to the second wafer 200, the method further includes grinding a surface of the first substrate 110 facing away from the first dielectric layer 120.

The first substrate 110 is ground to reduce a thickness of the first substrate 110 and reduce an incident optical path, and the difficulty of etching in subsequent formation of the pad groove and the isolation ring structure can be reduced.

A thickness of the first substrate 110 after being ground may be set according to an actual process requirement. In an example, the thickness of the first substrate 110 after being ground ranges from about 3 μm to 10 μm.

With reference to FIG. 6, an isolation ring structure 113 is formed in the first substrate 110 of the first region I, and the isolation ring structure 113 extends through the first substrate 110 along the direction from the first substrate 110 to the first dielectric layer 120 (902).

In this form, after the pad grooves are subsequently formed in the first substrate 110 and the first dielectric layer 120, the isolation ring structure 113 surrounds a periphery of the pad groove in the first substrate 110, so as to electrically isolate the pad groove.

Specifically, after the pad groove and the pad structure in the pad groove are formed in the first substrate 110 and the first dielectric layer 120, the isolation ring structure 113 is arranged, so that in the process of realizing the electrical connection of the pad structure to the outside or probing, an adverse effect of parasitic capacitance generated by a sidewall of the pad groove on the first substrate can be avoided, and electric leakage of the sidewall of the pad groove to the first substrate can be prevented. Therefore, the performance of the formed CMOS image sensor can be improved.

In this form, the isolation ring structure 113 includes a first deep trench isolation structure. After the pad groove and the pad structure in the pad groove are subsequently formed in the first substrate 110 and the first dielectric layer 120, the first deep trench isolation structure surrounds the periphery of the pad groove in the first substrate 110 and extends through the first substrate 110 along the direction from the first substrate to the first dielectric layer.

In this form, the first deep trench isolation structure includes a first deep trench, a first isolation layer on a bottom and a sidewall of the first deep trench, and a first conductive medium on the first isolation layer and filling the first deep trench.

Correspondingly, a step of forming the first deep trench isolation structure includes: forming a first deep trench (not shown) in the first substrate; forming a first isolation layer on a bottom and a sidewall of the first deep trench; and forming, on the first isolation layer, a first isolation material layer filled in the first deep trench, so as to form the first deep trench isolation structure.

A step of forming the first deep trench includes: forming a patterned first mask layer (not shown) on the surface of the first substrate 110 facing away from the first dielectric layer 120; etching the first substrate 110 by using the patterned first mask layer as a mask, to form the first deep trench (not shown); and removing the remaining first mask layer after the first deep trench is formed.

A material of the first mask layer is photoresist. Correspondingly, the process of forming the patterned first mask layer includes development and photolithography.

In this form, the process of etching the first substrate 110 by using the patterned first mask layer as the mask is a dry etching process.

In this form, a material of the first isolation layer is silicon oxide. In other forms, the first isolation layer may further be made of other suitable materials, such as a high-k dielectric material.

In this form, the process of forming the first isolation layer is an atomic layer deposition process.

In this form, the material of the first isolation material layer is tungsten. In other forms, the material of the first isolation material layer may further be polysilicon or other metal materials (such as copper).

The step of forming the first isolation material layer includes: forming a first initial isolation material layer covering the first substrate 110 and the first isolation layer and filling the first deep trench; and planarizing the first initial isolation material layer until the surface of the first substrate is exposed, to form the first isolation material layer.

In this form, the process of forming the first isolation material layer is a chemical vapor deposition process. Specifically, the first isolation material layer is formed by high-density plasma (HDP) chemical vapor deposition.

In this form, the process of planarizing the first isolation material layer is a chemical mechanical polishing process.

In other forms, the isolation ring structure may further include a shallow trench isolation structure and a second deep trench isolation structure on the shallow trench isolation structure.

In the form, the shallow trench isolation structure includes a shallow trench and a second isolation material layer filling the shallow trench. In additional forms, the shallow trench may further be selectively filled with a conductive medium, such as copper or tungsten.

In the form, a material of the second isolation material layer is silicon oxide.

In the form, the second deep trench isolation structure includes a second deep trench, a second isolation layer on a bottom and a sidewall of the second deep trench, and a second isolation material layer on the second isolation layer and filling the second deep trench.

For the second deep trench, the second isolation layer, and the second isolation material layer, reference is made to the corresponding content in the first deep trench isolation structure for implementation, and details will not be described herein again.

Correspondingly, the step of forming the shallow trench isolation structure and the second deep trench isolation structure on the shallow trench isolation structure includes: forming a shallow trench on a surface of the first substrate facing the first dielectric layer before bonding the first wafer to the second wafer; filling the shallow trench with the second isolation material layer to form the shallow trench isolation structure; forming a second deep trench in the first substrate above the shallow trench isolation structure after the first wafer is bonded to the second wafer; forming a second isolation layer on a bottom and a sidewall of the second deep trench; and forming, on the second isolation layer, a third isolation material layer filling the second deep trench, to form the second deep trench isolation structure.

The step of forming the shallow trench includes: forming a patterned second mask layer (not shown) on the surface of the first substrate 110 facing the first dielectric layer 120; etching the first substrate 110 by using the patterned second mask layer as a mask, to form the shallow trench; and removing the remaining second mask layer after the shallow trench is formed.

In the form, a material of the second mask layer is photoresist. Correspondingly, the process of forming the patterned second mask layer includes development and photolithography.

In the form, the process of etching the first substrate by using the patterned second mask layer as the mask is a dry etching process.

The step of filling the shallow trench with the second isolation material layer includes: forming a second isolation material layer covering the surface of the first substrate facing the first dielectric layer and filling the shallow trench; and planarizing the second isolation material layer until the surface of the first substrate facing the first dielectric layer is exposed.

In the form, the process of forming the second isolation material layer is a chemical vapor deposition process. In the form, the process of planarizing the first isolation material layer is a chemical mechanical polishing process.

For the method for forming the second deep trench isolation structure, reference is made to the method for forming the first deep trench isolation structure for implementation, and details will not be described herein again.

One isolation ring structure 113 is arranged by way of example above. It may be understood that a plurality of isolation ring structures may further be arranged according to an actual requirement. When a plurality of isolation ring structures are arranged, each isolation ring structure can be any of the shallow trench isolation structure or the second deep trench isolation structure on the shallow trench isolation structure.

A shape of the isolation ring structure 113 may be the same as or different from a shape of the first region I. As shown in FIG. 2, in this form, the shape of the isolation ring structure 113 is the same as the shape of the first region I, which is a rectangle. In other forms, the isolation ring structure may further be circular, or the like.

It should be noted that in the 3D stacked BSI CMOS image sensor, a shallow trench isolation structure and a deep trench isolation structure are formed in the first substrate 110 of the first wafer 100. The isolation ring structure 113 is formed together in the process step of forming the shallow trench isolation structure and the deep trench isolation structure in the first substrate 110, so that no additional mask is required to be added in the process of forming the isolation ring structure 113, which is beneficial to save process costs.

Figure 7:
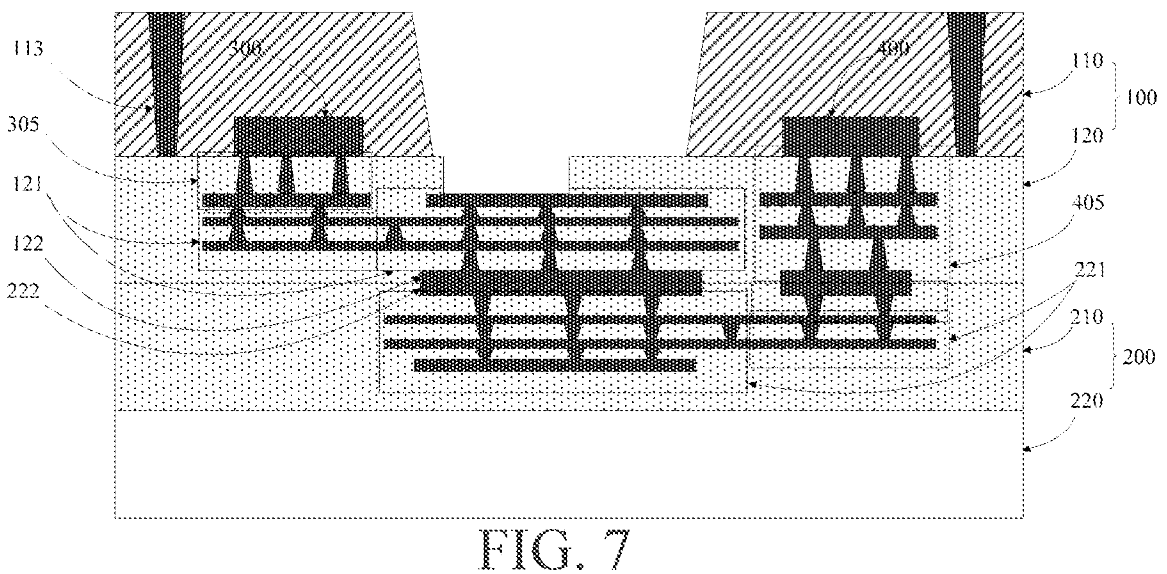

With reference to FIG. 7, a pad groove 111 is formed in the first substrate 110 and the first dielectric layer 120 of the first region I, and along the direction from the first substrate 110 to the first dielectric layer 120, the pad groove 111 extends through the first substrate 110 and further extends into a partial thickness of the first dielectric layer 120 (903).

The pad groove 111 is configured for the pad structure 112 to be formed in the pad groove, so as to electrically lead out the semiconductor structure through the pad structure 112.

In this form, the pad groove 111 extends through the first substrate 110 along the direction from the first substrate 110 to the first dielectric layer 120, and further extends into a partial thickness of the first dielectric layer 120, so that the pad structure 112 formed in the pad groove may partially extend into the first dielectric layer 120 and contact the first interconnecting structure formed in the first dielectric layer 120, so as to enable the electrical connection to the first interconnecting structure.

In this form, the pad groove 111 includes a first interconnecting via (not shown) in the first dielectric layer 120 and a first interconnecting trench (not shown) in the first substrate 110. The first interconnecting trench is in communication with the first interconnecting via and is located above the first interconnecting via.

Correspondingly, the step of forming the pad groove 111 includes: forming a patterned third mask layer on the surface of the first substrate 110 facing away from the first dielectric layer 120; etching the first substrate 110 by using the third mask layer as a mask, to form a first interconnecting trench extending through the first substrate 110 along the direction from the first substrate 110 to the first dielectric layer 120; and etching the first dielectric layer 120 on a bottom of the first interconnecting trench to the partial thickness after the first interconnecting trench is formed, to form the first interconnecting via.

In this form, the third mask layer is a photoresist layer. Correspondingly, the process of forming the patterned third mask layer includes development, photolithography, and the like.

In this form, the process of etching the first substrate 110 and the partial thickness of the first dielectric layer 120 by using the third mask layer as a mask is a dry etching process. Specifically, the dry etching process is a deep plasma dry etching process. Through deep plasma etching, the first interconnecting trench and the first interconnecting via having relatively smooth inner walls can be fabricated, thereby causing little mechanical and physical damage to the first substrate and the first dielectric layer. In other forms, the process for forming the pad groove may further be laser processing, potassium hydroxide wet etching, photo-electrochemical etching, or the like.

Figure 8:
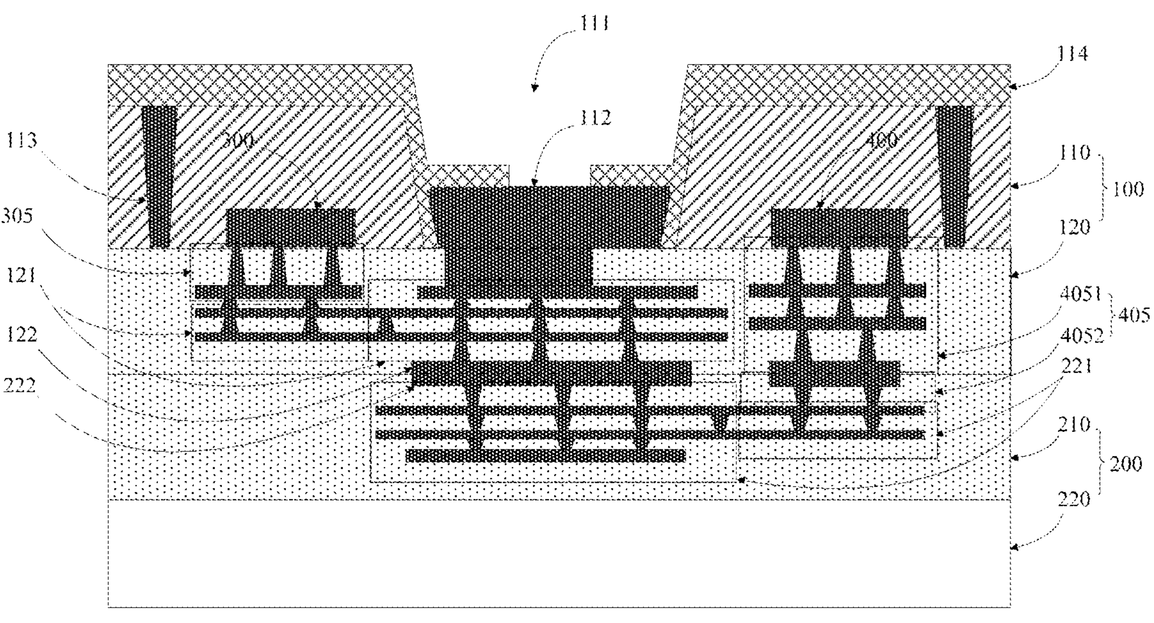

With reference to FIG. 8, the pad structure 112 is formed in the pad groove 111 (904).

The pad structure 112 is configured to electrically lead out the formed semiconductor structure. Specifically, the pad structure 112 is configured to electrically lead out the formed 3D stacked BSI CMOS image sensor.

In this form, the pad structure 112 includes a pad via (not shown) and a metal pad layer (not shown) above the pad via. In other forms, the pad structure 112 may further include a plurality of metal pad layers and a plurality of pad vias used for interconnecting the metal pad layers.

In this form, a material of the pad structure is aluminum. Aluminum has a light weight, strong machinability, good physical and mechanical properties, and good resistance to corrosion, and is adapted to be used as the material of the pad structure.

In this form, the semiconductor structure further includes a passivation layer 114, arranged on a surface of the first substrate 110 facing away from the first dielectric layer 120 and covering a sidewall of the pad groove 111 and a portion of a top surface of the pad structure 112.

The passivation layer 114 is configured to enable isolation between the sidewall of the pad groove 111 and the first substrate 110, and protect the surface of the first substrate facing away from the first dielectric layer, the sidewall of the pad groove 111, and the part of the top surface of the pad structure 112. In addition, the passivation layer 114 is further configured to protect the surface of the first substrate 110 facing away from the first dielectric layer 120, the sidewall of the pad groove 111, and the part of the top surface of the pad structure 112.

In this form, a material of the passivation layer 114 is silicon nitride (SiN). In other forms, the material of the passivation layer 114 may further be at least one of silicon oxide ($SiO_2$), silicon carbide (SiC), tetraethoxysilane silicon dioxide (PETEOS), or ethyl silicate (TEOS).

In this form, after the pad groove 111 is formed, the passivation layer 114 and the pad structure 112 are formed in a same process step.

Specifically, a step of forming the passivation layer 114 and the pad structure 112 includes: filling the first interconnecting via with the pad material to form a pad via; forming a second passivation layer that conformally covers a surface of the first substrate and a bottom and a sidewall of the pad groove after the pad via is formed, where the second passivation layer further covers the pad via; etching the second passivation layer on the bottom of the pad groove to form a pad interconnecting groove; forming a pad interconnecting layer in the pad groove; forming a third passivation layer covering the second passivation layer and the pad interconnecting layer; and etching the third passivation layer to form an opening on the pad interconnecting layer, where a portion of a top surface of the pad interconnecting layer is exposed from the opening.

In this form, after the pad structure 112 and the passivation layer 114 are formed, the opening is configured as an electrical lead-out window of the pad structure 112, so that the electrical connection between the pad structure 112 and the outside is enabled through the electrical lead-out window. Therefore, the electrical connection between the 3D stacked BSI CMOS image sensor and the outside is enabled, and the probing of the 3D stacked BSI CMOS image sensor is enabled.

Although the present disclosure is disclosed above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A semiconductor structure, comprising: a first wafer, comprising a first substrate and a first dielectric layer on the first substrate, wherein a pad groove and a pad structure in the pad groove are formed in the first substrate and the first dielectric layer, and the pad groove extends through the first substrate along a direction from the first substrate to the first dielectric layer and extends into a partial thickness of the first dielectric layer; and a plurality of isolation ring structures, wherein one of the plurality of isolation ring structures, arranged in the first substrate around the pad groove and extending through the first substrate along the direction from the first substrate to the first dielectric layer.

2. The semiconductor structure according to claim 1, wherein a spacing between the isolation ring structure and the pad groove is greater than 10 μm.

3. The semiconductor structure according to claim 1, wherein one of the plurality of isolation ring structures comprises: a first deep trench isolation structure; or a shallow trench isolation structure and a second deep trench isolation structure on the shallow trench isolation structure.

4. The semiconductor structure according to claim 3, wherein the first deep trench isolation structure comprises a first deep trench, a first isolation layer on a bottom and a sidewall of the first deep trench, and a first isolation material layer on the first isolation layer and filling the first deep trench.

5. The semiconductor structure according to claim 4, wherein a material of the first isolation layer comprises at least one of silicon oxide, silicon nitride, or a high-k dielectric material.

6. The semiconductor structure according to claim 4, wherein the first isolation material layer comprises at least one of polysilicon, copper, or tungsten.

7. The semiconductor structure according to claim 3, wherein a material of the shallow trench isolation structure comprises a shallow trench and a second isolation material layer in the shallow trench.

8. The semiconductor structure according to claim 3, wherein the second deep trench isolation structure comprises a second deep trench, a second isolation layer on a bottom and a sidewall of the second deep trench, and a third isolation material layer on the second isolation layer and filling the second deep trench.

9. The semiconductor structure according to claim 8, wherein a material of the second isolation layer comprises at least one of silicon oxide, silicon nitride, or a high-k dielectric material.

10. The semiconductor structure according to claim 8, wherein the third isolation material layer comprises at least one of polysilicon, copper, or tungsten.

11. The semiconductor structure according to claim 1, further comprising:

a second wafer, bonded to the first wafer and comprising a second substrate and a second dielectric layer on the second substrate, wherein the second dielectric layer faces the first dielectric layer.

12. The semiconductor structure according to claim 11, wherein the first wafer further comprises:

a first interconnecting structure, arranged in the first dielectric layer and electrically connected to the pad structure; and a first bonding and interconnecting layer, arranged in the first dielectric layer above the pad structure and electrically connected to the pad structure and the second wafer.

13. The semiconductor structure according to claim 12, wherein the second wafer further comprises:

a second interconnecting structure, arranged in the second substrate; and a second bonding and interconnecting layer, arranged in the second substrate above the second interconnecting structure and electrically connected to the second interconnecting structure and the first bonding and interconnecting layer.

14. The semiconductor structure according to claim 13, wherein the semiconductor structure further comprises at least one of the following modules:

a first electro-static discharge (ESD) protection module, arranged in the first substrate on a first side of the pad groove and inside the isolation ring structure, and electrically connected to the first wafer; or a second ESD protection module, arranged in the first substrate on a second side of the pad groove and inside the isolation ring structure, and electrically connected to the second wafer, wherein the first side is arranged opposite to the second side.

15. The semiconductor structure according to claim 14, further comprising:

a first device interconnecting structure, arranged in the first dielectric layer below the first ESD protection module and electrically connected to the first ESD protection module and the first interconnecting structure, to enable an electrical connection between the first ESD protection module and the first wafer; or a second device interconnecting structure, arranged in the first dielectric layer and the second dielectric layer below the second ESD protection module and electrically connected to the second ESD protection module and the second interconnecting structure, to enable an electrical connection between the second ESD protection module and the second wafer.

16. The semiconductor structure according to claim 1, further comprising:

a passivation layer, arranged on a surface of the first substrate facing away from the first dielectric layer and covering a sidewall of the pad groove and a portion of a top surface of the pad structure.

17. A method for forming a semiconductor structure, comprising:

providing a first wafer, wherein the first wafer comprises a first substrate and a first dielectric layer on the first substrate;

forming an isolation ring structure in the first substrate;

forming a pad groove in the first substrate and the first dielectric layer, wherein the pad groove extends through the first substrate along a direction from the first substrate to the first dielectric layer and extends into a partial thickness of the first dielectric layer, and the pad groove is surrounded by the isolation ring structure in the first substrate;

forming a pad structure in the pad groove;

providing a second wafer, wherein the second wafer comprises a second substrate and a second dielectric layer on the second substrate;

orienting the first dielectric layer toward the second dielectric layer;

inverting the first wafer on the second wafer; and bonding the first wafer to the second wafer.

18. The method for forming the semiconductor structure according to claim 17, wherein the isolation ring structure comprises a first deep trench isolation structure or a shallow trench isolation structure and a second deep trench isolation structure on the shallow trench isolation structure, and forming the isolation ring structure in the first substrate comprises:

forming a first deep trench in the first substrate after the first wafer is bonded to the second wafer; forming a first isolation layer on a bottom and a sidewall of the first deep trench; and forming, on the first isolation layer, a first isolation material layer filling the first deep trench, to form the first deep trench isolation structure; or forming a shallow trench on a surface of the first substrate facing the first dielectric layer before bonding the first wafer to the second wafer; filling the shallow trench with the second isolation material layer to form the shallow trench isolation structure; forming a second deep trench on the shallow trench isolation structure after the first wafer is bonded to the second wafer; forming a second isolation layer on a bottom and a sidewall of the second deep trench; and forming, on the second isolation layer, a third isolation material layer filling the second deep trench, to form the second deep trench isolation structure.

* * * * *